(12) United States Patent
Yin et al.

(10) Patent No.: US 7,576,441 B2
(45) Date of Patent: Aug. 18, 2009

(54) BORON-DOPED AMORPHOUS CARBON FILM FOR USE AS A HARD ETCH MASK DURING THE FORMATION OF A SEMICONDUCTOR DEVICE

(75) Inventors: Zhiping Yin, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 424 days.

(21) Appl. No.: 11/214,367

(22) Filed: Aug. 29, 2005

(65) Prior Publication Data
US 2006/0006502 A1    Jan. 12, 2006

Related U.S. Application Data

(62) Division of application No. 10/463,185, filed on Jun. 17, 2003, now Pat. No. 6,939,794.

(51) Int. Cl.
*H01L 23/544* (2006.01)
(52) U.S. Cl. .............................. 257/797; 257/E23.179

(58) Field of Classification Search ................... 257/797; 438/401, 462, 975
See application file for complete search history.

(56) References Cited

U.S. PATENT DOCUMENTS

| | | | |
|---|---|---|---|
| 4,675,265 A | 6/1987 | Kazama et al. | 430/67 |
| 6,303,225 B1 * | 10/2001 | Veerasamy | 428/408 |
| 6,333,255 B1 | 12/2001 | Sekiguchi | 438/622 |
| 6,424,044 B1 * | 7/2002 | Han et al. | 257/758 |
| 6,469,425 B1 | 10/2002 | Sakai et al. | 313/310 |
| 6,770,575 B2 | 8/2004 | Towle | 438/783 |
| 6,864,556 B1 * | 3/2005 | You et al. | 257/437 |
| 7,129,180 B2 * | 10/2006 | Sandhu et al. | 438/717 |
| 2002/0088707 A1 * | 7/2002 | Towle | 204/192.15 |
| 2002/0177301 A1 * | 11/2002 | Biolsi et al. | 438/637 |
| 2004/0259355 A1 | 12/2004 | Yin et al. | 438/689 |
| 2005/0064718 A1 | 3/2005 | Yin et al. | 438/723 |

* cited by examiner

*Primary Examiner*—Thanh Nguyen

(57) ABSTRACT

A hard mask comprising boron-doped amorphous carbon, and a method for forming the hard mask, provides improved resistance to etches of a variety of materials compared with previous amorphous carbon hard mask layers.

5 Claims, 7 Drawing Sheets

BORON-DOPED AMORPHOUS CARBON FILM FOR USE AS A HARD ETCH MASK DURING THE FORMATION OF A SEMICONDUCTOR DEVICE

This is a division of U.S. Ser. No. 10/463,185 filed Jun. 17, 2003 and issued Sep. 6, 2005 as U.S. Pat. No. 6,939,794.

FIELD OF THE INVENTION

This invention relates to the field of semiconductor manufacture and, more particularly, to a hard etch mask comprising boron-doped amorphous carbon for use in forming a semiconductor device.

BACKGROUND OF THE INVENTION

During the formation of a semiconductor device such as memory devices, logic devices, microprocessors, etc., several photolithography steps are typically required. Each photolithography step includes the formation of a blanket photoresist (resist) layer, exposing portions of the resist layer to light using a mask or reticle, removing the exposed resist portions (or the unexposed resist portions if negative resist is used), etching the underlying layer using the resist as a pattern, then stripping the resist.

Another layer related to photolithography is the formation of a hard mask. A hard mask is formed as a blanket layer over the layer to be etched. The patterned resist layer is formed over the hard mask, then the hard mask is etched using the resist as a pattern. After patterning the hard mask, the resist can be removed, or it may remain in place. If the resist is removed the hard mask is the sole pattern for etching the underlying layer; otherwise, the hard mask provides a more robust mask than the resist alone if the resist should be completely eroded away, thereby avoiding the removal of any portion of the underlying layer which is to remain. Etching with the photoresist in place may result in organic resin deposits which can be detrimental, but may also aid in reducing lateral etching of the layer to be etched by depositing polymers along sidewalls of the opening being etched in the underlying layer. While a hard mask requires a separate layer to be formed, etched, and removed, and therefore adds production costs, it is often used because it provides improved resistance to the etch and, overall, reduces costs.

Semiconductor engineers are continually striving to develop hard masks which have improved resistance to an etch when compared with underlying layers. The improved selectivity allows for thinner hard masks, which require less time to be formed and removed, decreases the aspect ratio of the etch, and decreases costs when compared with a thicker hard mask layer.

A material which is presently used as a hard mask includes amorphous carbon (a-C). When etching oxide using a-C as a hard mask, the etch removes the oxide about 10 times faster than it removes the a-C, thereby providing a 10:1 oxide to a-C etch rate.

Present designs of semiconductor devices have aspect ratios which can approach, and may in fact exceed, 10:1 (i.e. the depth of the opening is 10 times greater than the diameter of the opening). To etch this deeply relative to the diameter of the opening requires a long etch time, and therefore a thick hard mask. Amorphous carbon is a translucent material, and as the thickness of the hard mask increases there is increased difficulty in reading alignment or "combi" marks on the semiconductor wafer. Further, increasing the thickness of the hard mask layer requires increasing the deposition time, which increases costs.

A new method for increasing the etch resistance of a-C during the etch of an oxide layer, and the resulting new a-C hard mask, would be desirable.

SUMMARY OF THE INVENTION

An embodiment of the present invention provides a new method which, among other advantages, results in a hard mask which has improved resistance to an etch of oxide such as borophosphosilicate glass (BPSG) and tetraethyl orthosilicate (TEOS), and is also useful as a hard mask while etching nitride, tungsten, monocrystalline silicon, and polysilicon. The hard mask layer comprises an amorphous carbon (a-C) layer doped with boron. A method for forming the hard mask layer, as well as exemplary uses of the hard mask layer, are described.

Additional advantages will become apparent to those skilled in the art from the following detailed description read in conjunction with the appended claims and the drawings attached hereto.

Figure 1:
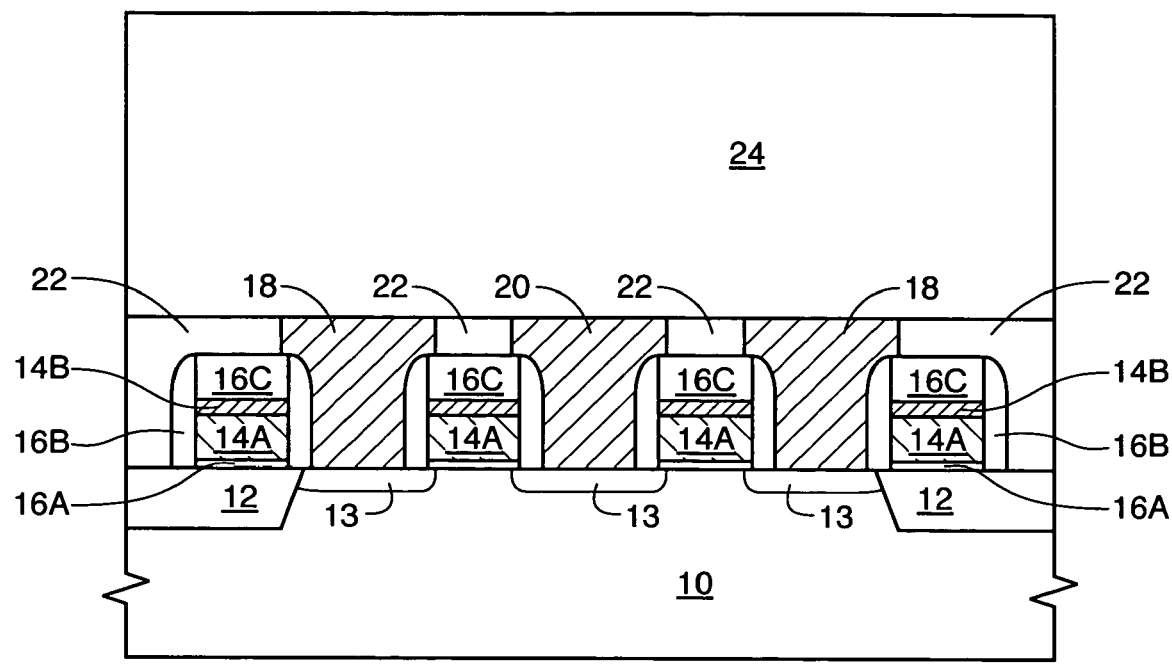
FIGS. 1-6 are cross sections depicting a first application of a hard mask layer of an embodiment of the present invention.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but could be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

A hard mask layer which provides improved resistance to an etch of an underlying layer can be formed more thinly and allows a reduction in an aspect ratio of an opening formed in the underlying layer. This thinner hard mask layer, depending on its transparency, may also allow the detection of alignment marks on the wafer through the hard mask layer.

A inventive method for forming an amorphous carbon (a-C) layer results in a layer which has increased resistance to various etches than previous a-C layers. This increase in etch resistance results from doping the a-C layer with boron to form a boron-doped a-C (herein "a-C:B") layer.

The a-C:B layer of the present embodiment may formed using a plasma enhanced chemical vapor deposition (PECVD) process. A semiconductor wafer is placed into a PECVD chamber, then the chamber is set to a temperature of between about 400° C. and about 650° C., preferably about 550° C. At temperature, propylene ($C_3H_6$) is introduced into the chamber at a flow rate of between about 300 standard cubic centimeters per minute (sccm) and about 1,500 sccm, preferably about 600 sccm, along with diborane ($B_2H_6$) at a flow rate of between about 100 sccm and about 2,000 sccm, and more preferably between about 250 sccm and about 1,200 sccm and, optionally, helium (He) at a flow rate of between about 200 sccm and about 2,000 sccm, preferably about 325 sccm. If used, the helium may assist in the formation of a more uniform layer. During the introduction of gasses, the PECVD chamber is subjected to a radio frequency (RF) power of between about 100 watts (W) and about 1,000 W, preferably about 700 W, and a pressure of between about 4.0 torr (T) and about 8.0 T, preferably about 6.0 T. This process forms an a-C:B layer at a rate of about 800 angstroms (Å) per minute to about 5,000 Å (5 KÅ) per minute, depending on the gas flow rates and the rates of the other parameters as described above. Table 1 summarizes these conditions.

TABLE 1

Summary of Variable Ranges to Form a Boron-Doped Amorphous Carbon Layer

| Variable | Broad Range | Narrow Range/Typical |
|---|---|---|
| Temperature | 400-650° C. | 550° C. |
| $C_3H_6$ flow rate | 300-1,500 sccm | 600 sccm |
| $B_2H_6$ flow rate | 100-2,000 sccm | 150-1,200 sccm |
| He flow rate | 200-2,000 sccm | 325 sccm |
| RF Power | 100-1,000 watts | 700 watts |
| Pressure | 4.0-8.0 Torr | 6.0 Torr |
| a-C:B formation rate | 800-5,000 Å/minute | 1,200-3,500 Å/minute |

The deposition process above dopes the amorphous carbon with boron to between about 1 atom percent (atom %) and about 35 atom %, more preferably to between about 3 atom % and about 25 atom %, and most preferably to between about 5 atom % and about 20 atom %, depending on the $B_2H_6$ flow rate relative to the flow rates of the propylene and (if used) helium. With benefit of the present description, alteration of the gas flow rates to result in the desired boron atom % can be accomplished by one of ordinary skill in the art.

With increasing atom % of boron, the amorphous carbon formed within the power range described above, particularly in the range of 400 W to 700 W, becomes less translucent tending toward opaque, and it becomes more difficult to read alignment indicia or "combi" marks etched into the silicon wafer through the a-C:B layer for a layer of a given thickness. Thus while increasing the atom % of boron increases the etch resistance of the film, it becomes more difficult to pattern the layer using conventional photolithography due to the difficulty in aligning a reticle with the wafer using combi marks on the wafer. This is of course dependent on the thickness of the hard mask layer, and the thinner the hard mask the more heavily the a-C:B layer can be doped while maintaining a sufficient translucency through the layer. Rather than forming a hard mask layer highly doped with boron, it may be preferable to form a thicker and clearer a-C:B layer with a lower doping concentration. However, with very high aspect ratio openings, it may be possible to form a very thin, highly-doped a-C:B layer which allows sufficient light to pass therethrough to read combis, is highly resistant to an etch, and does not add excessively to an already high aspect ratio. Thus the thickness of the a-C:B layer as well as its boron atom % may be selected with regard to the thickness of the oxide or other material to be removed, the aspect ratio of the opening, the etch rate of the a-C:B relative to the etch rate of the material to be etched, and the desired production throughput.

FIGS. 1-6 depict one exemplary use of the invention to form a capacitor bottom plate during the formation of a semiconductor memory device such as a dynamic random access memory (DRAM). FIG. 1 depicts a semiconductor wafer substrate assembly comprising a semiconductor wafer 10, shallow trench isolation (STI) field oxide 12, doped wafer areas 13, transistor control gates for example comprising a tungsten nitride gate 14A and tungsten conductive enhancement layer 14B (or polysilicon gate and silicide), and surrounding dielectric typically comprising gate oxide 16A, nitride or aluminum oxide ($Al_2O_3$) spacers 16B, and capping layer 16C, for example TEOS or nitride. FIG. 1 further depicts polysilicon contact pads including pads 18 to which container capacitors will be electrically coupled and pads 20 which will form a portion of a digit line contact to the wafer 10. The pads are separated by a dielectric layer 22, for example BPSG. Also depicted is a second layer of dielectric 24 which can be one or more layers of TEOS and/or BPSG. In this exemplary embodiment, layer 24 has a thickness of about 23 KÅ. This structure can be formed according to means known in the art from the description herein.

Figure 2:
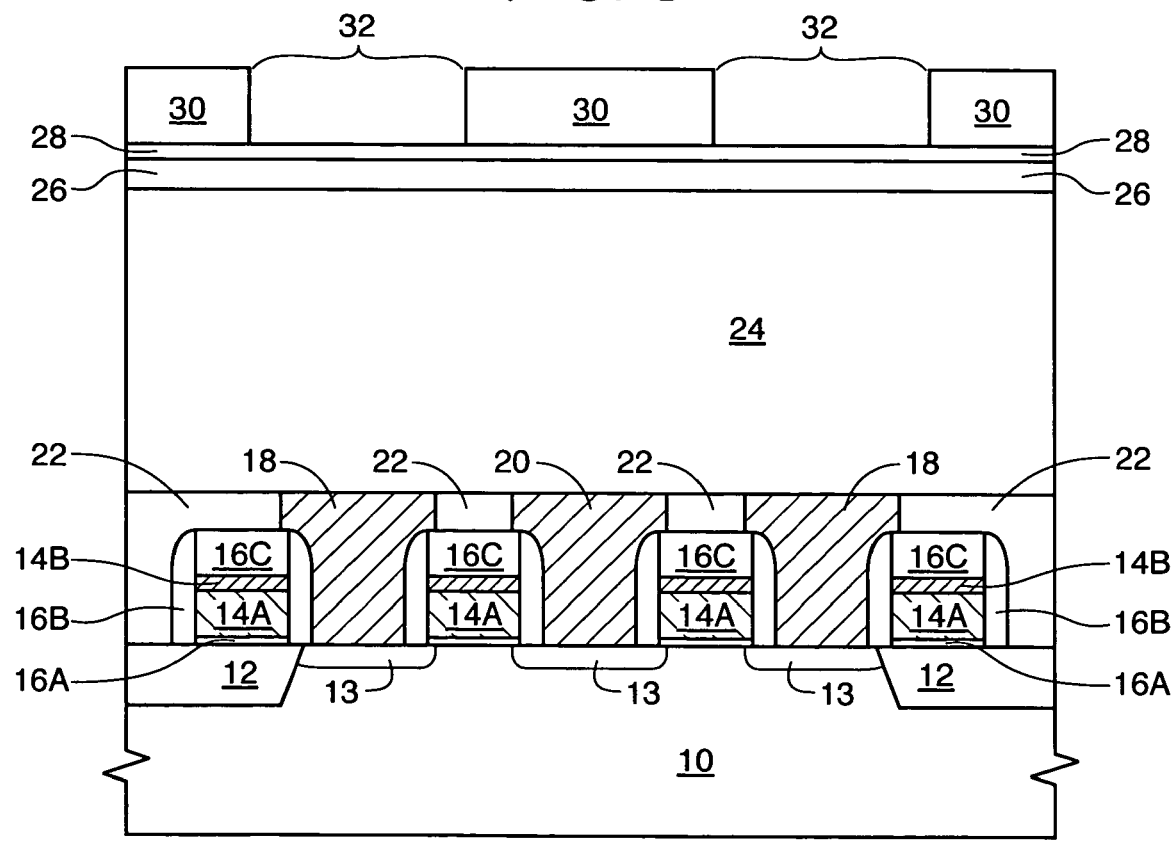
Figure 3:
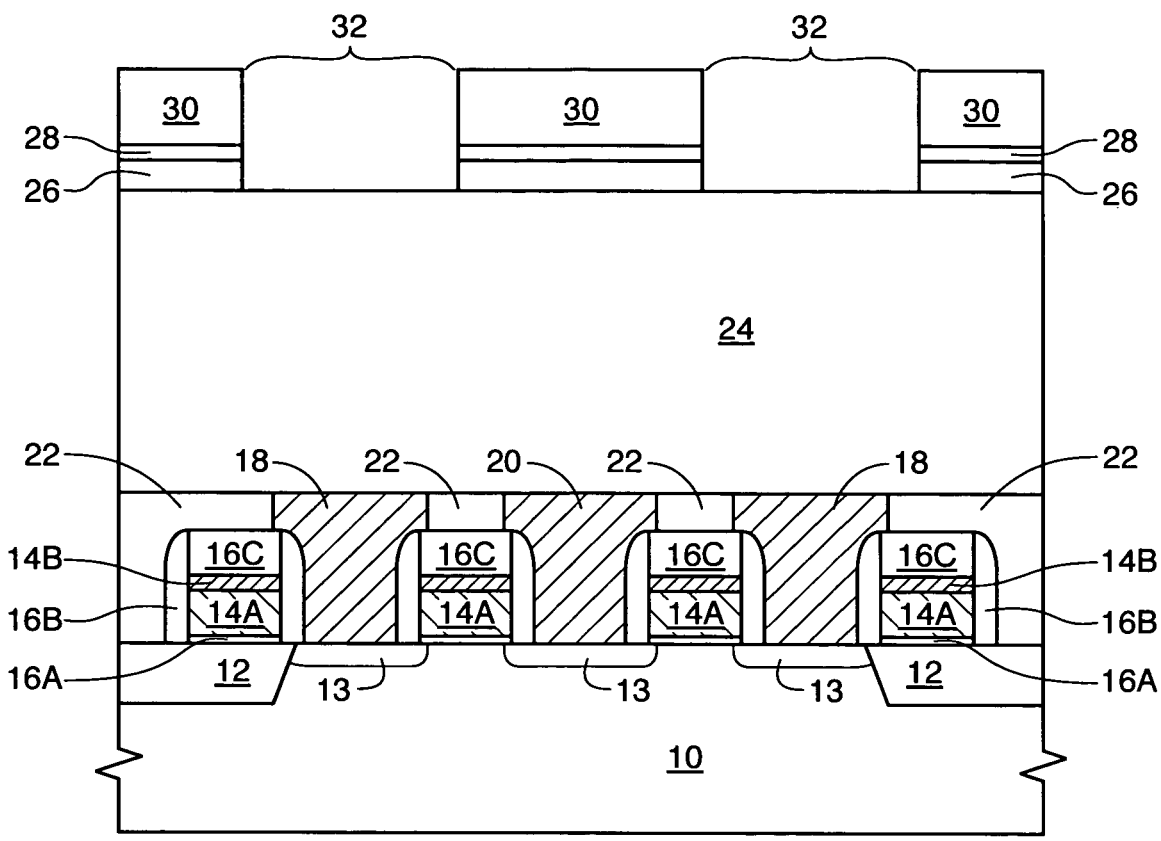

After forming the FIG. 1 structure, a blanket a-C:B layer 26 is formed over oxide 24 as depicted in FIG. 2. For this embodiment the a-C:B layer can be formed using the above-stated method to a thickness of between about 800 Å and about 3 KÅ and to a boron concentration of between about 5 atom % and about 20 atom %. A dielectric antireflective coating (DARC) layer 28 is formed to reduce reflectivity during resist patterning. Layer 28 also provides an etch mask during a subsequent etch of the a-C:B layer and allows removal of the resist after patterning the DARC but before patterning the a-C:B. Subsequently, the patterned DARC layer can be used to pattern the a-C:B. An organic antireflective coating (not depicted) layer may be used optionally over DARC layer 28 for photoresist performance enhancement. Next, a patterned photoresist layer 30 is formed over the DARC layer 28 and the a-C:B layer 26 according to means known in the art with openings 32 therein, for example having a diameter of about 1,500 Å to about 2,500 Å. Openings 32 overlie pads 18 to which the container capacitors will be electrically coupled.

Subsequently, the DARC layer 28 of FIG. 2 is patterned using a vertical anisotropic etch which removes the exposed portions of DARC 28 and stops on the a-C:B layer. An etch which would pattern the DARC layer selective to the a-C:B layer (i.e. etches the DARC layer while etching the a-C:B layer very little or not at all) includes an etch using $CF_4$ and helium. Subsequently, the a-C:B layer 26 is patterned by etching the a-C:B layer selective to the oxide layer 24 and DARC layer 28, for example using an etch comprising $CF_4$ at a flow rate of about 5 sccm, sulfur dioxide ($SO_2$) at a flow rate of about 40 sccm, and $O_2$ at a flow rate of about 30 sccm. The rate of removal using this etch depends on the boron concentration, but for a boron concentration of about 10 atom % the a-C:B layer will be removed at a rate of about 20 Å per second and results in the structure of FIG. 3.

Figure 4:
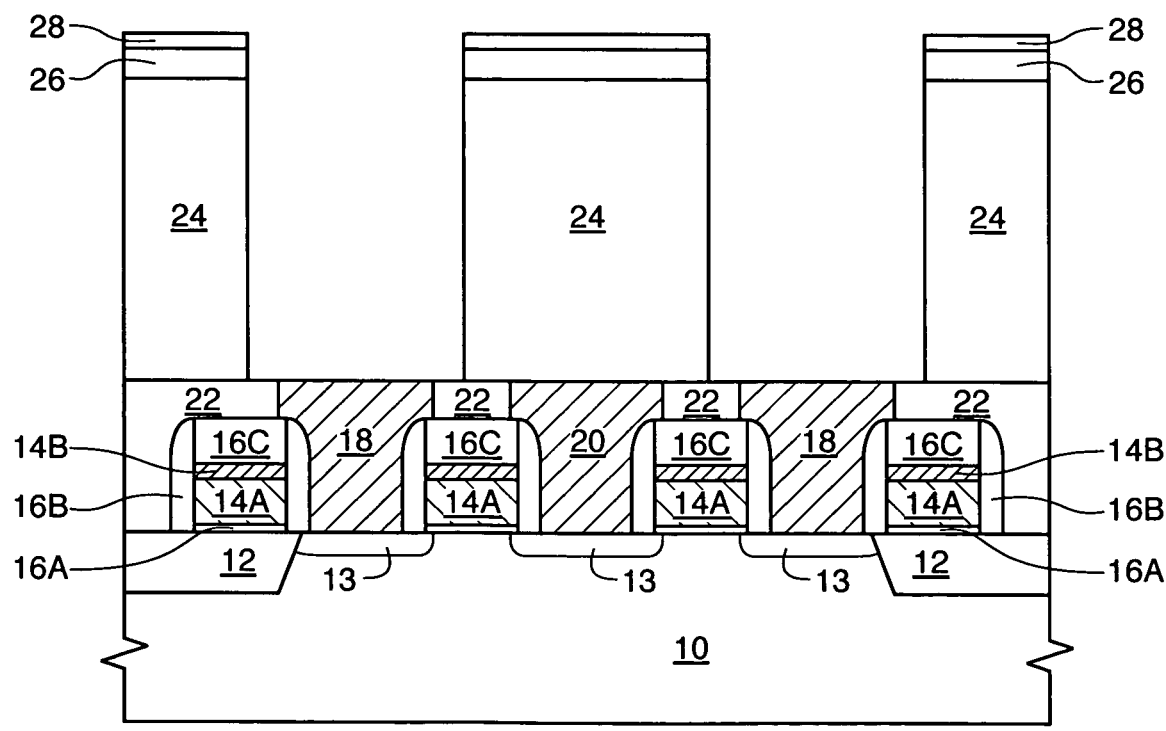
Figure 5:
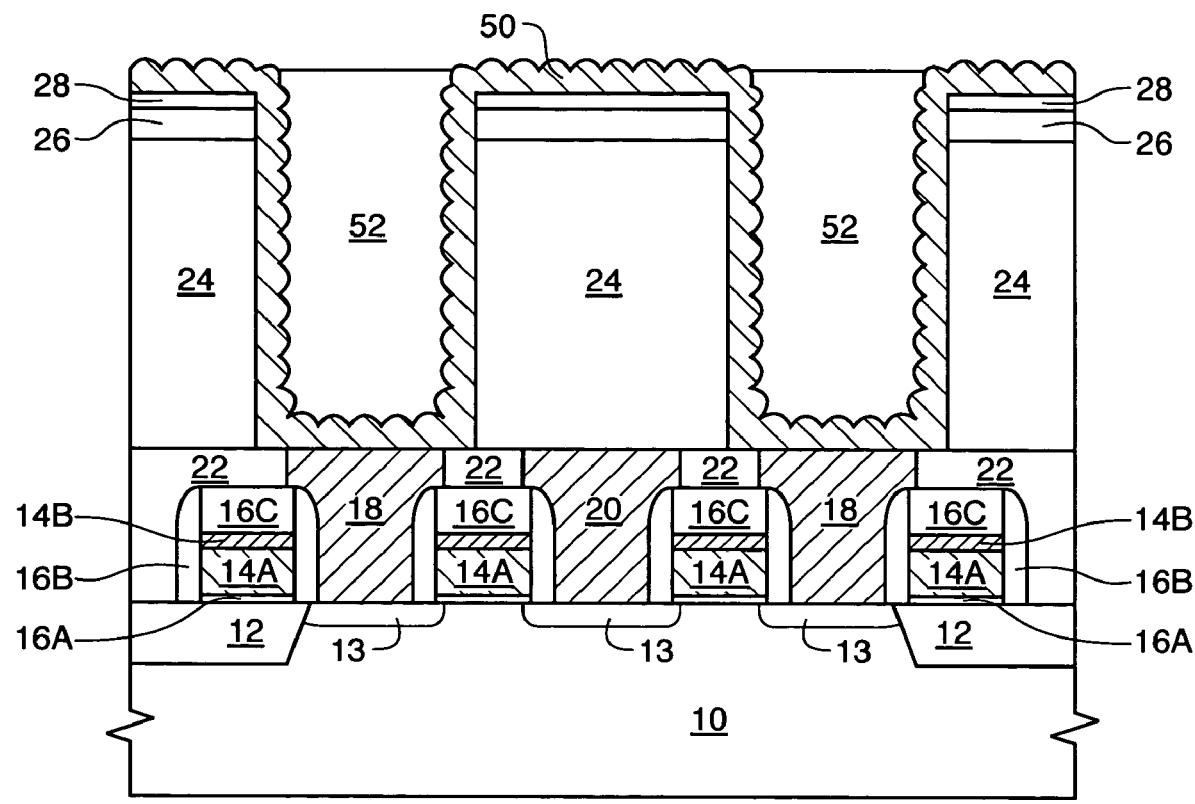
Figure 6:
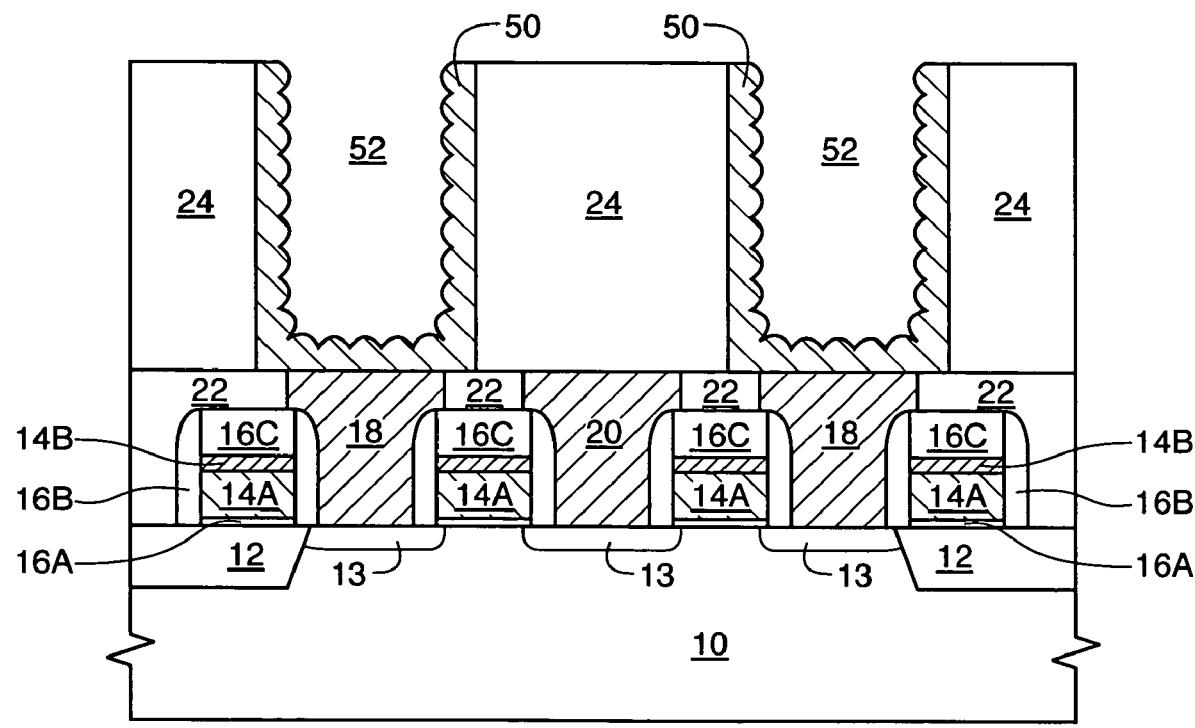

Next, resist 30 may be removed, or may optionally remain in place. Removing the resist prevents polymers from forming within the opening in oxide 24 during the etch which, depending on the aspect ratio of the opening, can be difficult to remove. In the alternative, if resist 30 remains in place during the etch of layer 24 it may reduce lateral etching of the oxide. In either case the oxide is etched to expose polysilicon pads 18 as depicted in FIG. 4 and to define the storage capacitor bottom plate within oxide layer 24. After forming the FIG. 4 structure, a capacitor bottom plate is formed within the opening, for example using a CVD textured hemispherical silicon grain (HSG) polysilicon process as known in the art, to form the bottom plate 50 of FIG. 5. As depicted, the bottom plate is formed over the hard mask layer 24, and the opening is filled with a sacrificial material 52 such as a spun-on photoresist. Subsequently, the FIG. 5 structure is subjected to a mechanical planarization such as a chemical mechanical planarization to remove the HSG 50 overlying the DARC layer, and to remove the DARC layer 28 and the hard mask 26. During this step the sacrificial material 52 prevents the planarized material, which can be difficult to remove, from entering the etched opening in layer 24. After performing the planarization, the resist 52 within the opening in the HSG is removed to result in the structure of FIG. 6. Wafer processing then continues according to means known in the art to form a semiconductor memory device.

The above embodiments of the invention have the advantage of providing a thin hard mask layer to form a high aspect ratio opening. A thicker hard mask layer, or a thicker photoresist layer, adds to the already high aspect of the opening which must be etched in the oxide. In present DRAM designs where some openings require an aspect ratio of 10:1 for some features, forming the hard mask layer as thinly as possible reduces the overall aspect ratio of the opening which must be etched. As the a-C:B layer has a high resistance to an oxide etch, the layer may be formed very thinly. Conventional a-C layers have an oxide:hard mask etch ratio of about 10:1, while an a-C:B hard mask doped with boron to between about 2 atom % and about 20 atom % has an etch ratio which is improved about 20% to about 40% in the etch of the FIG. 4 structure, or an etch ratio of between about 12:1 to about 14:1, and an improvement of between about 30% and about 50% in an etch of a blanket wafer. In addition to reducing the aspect ratio, the thinner film simplifies mask alignment with the combi on the wafer.

Figure 7:
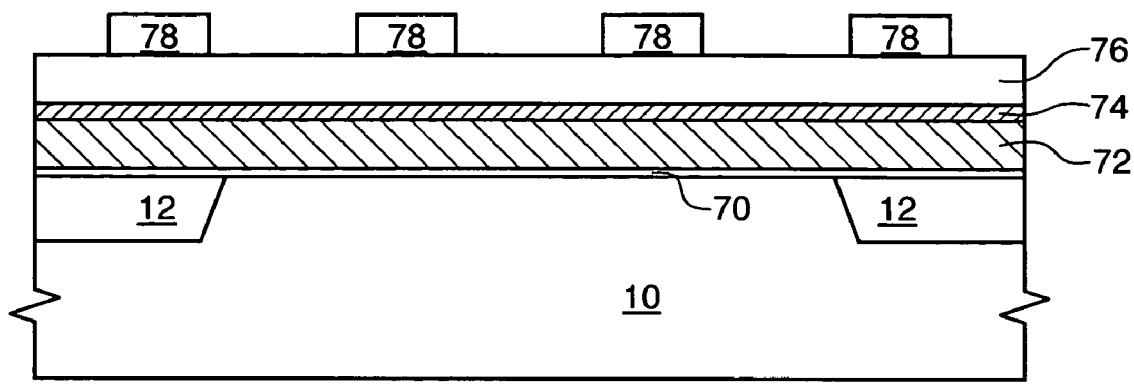
FIGS. 7-9 are cross sections depicting a second application of the hard mask layer of an embodiment of the present invention.
Figure 8:
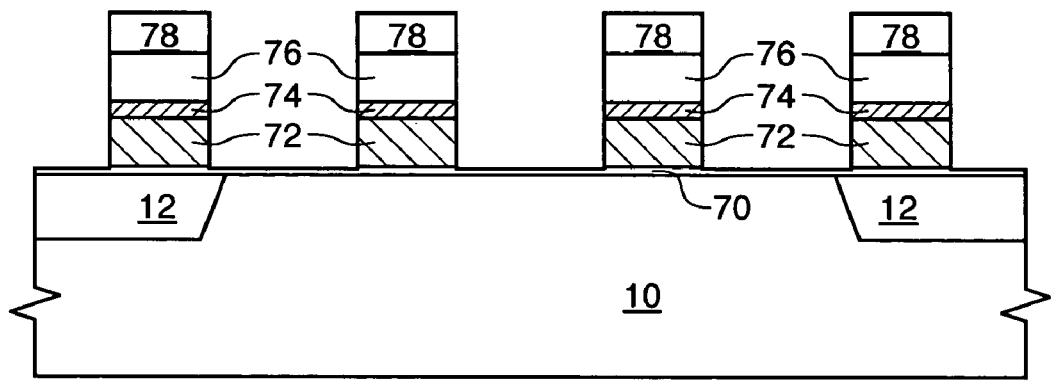
Figure 9:
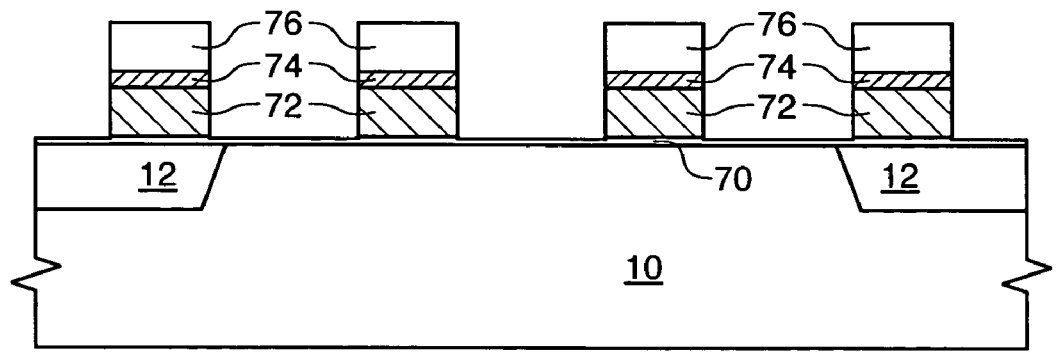

FIGS. 7-9 illustrate embodiments of the invention as a hard mask layer during the etch of a transistor gate stack (memory device word line). FIG. 7 depicts a semiconductor wafer substrate assembly comprising a semiconductor wafer 10 and STI field oxide 12. FIG. 7 further depicts blanket layers of gate oxide 70, word line tungsten nitride 72, tungsten conductive enhancement layer 74, silicon nitride 76, and a patterned a-C:B hard mask 78. A DARC layer in accordance with previous embodiments and/or a bottom antireflective coating (BARC, not depicted) may also be used. A transistor gate stack with current design rules comprises gate oxide about 37 Å thick, word line tungsten nitride 50 Å thick, tungsten conductive enhancement layer about 150 Å thick, and silicon nitride about 1,300 Å thick. In this case, the a-C:B layer can be formed to have boron doping between about 5 atom % and about 20 atom %, and to be from about 800 Å to about 1,200 Å thick.

After forming the FIG. 7 structure, an etch is performed to removed the exposed portions of layers 76, 74, and 72 to result in the structure of FIG. 8. Silicon nitride capping layer 76 can be etched using flows comprising $CF_4$, $CH_2F_2$, and He. Tungsten conductive enhancement layer 74 can be etched using flows comprising $NF_3$ and $Cl_2$, and the tungsten nitride word line can be etched using $NF_3$. Typically, at least a portion of gate oxide 70 remains so that wafer 10 is not exposed, as this would result in a native oxidation of the silicon wafer.

After the transistor gate stack is etched to form the FIG. 8 structure, the a-C:B hard mask 78 is removed using an ash process with a standard oxygen ($O_2$) plasma for resist removal. With higher boron concentrations (above about 7 atom %) a modified ash process may be required by adding $CF_4$ or $H_2$ into a standard $O_2$ plasma etch. After removing the a-C:B film, the structure of FIG. 9 remains. Subsequently, wafer processing continues to form a semiconductor device such as a semiconductor memory device.

The a-C:B hard mask in this exemplary embodiment is advantageous as it is highly resistant to an etch which removes a variety of materials including TEOS and gate oxides, tungsten, tungsten silicide, polysilicon, and shallow trench isolation (STI). The hard mask, however, can be removed using the above-stated ash process which has very little effect on TEOS and gate oxides, tungsten, tungsten silicide, nitride, and polysilicon.

In another embodiment, the formation process is modified from previous embodiments to result in a layer which has an increased boron concentration and increased transparency in the visible light range over layers formed in accordance with previous processes described herein. A more transparent layer increases the readability of alignment indicia on the wafer through the mask layer. In this embodiment, the RF power is decreased to between about 80 W and about 400 W, more preferably to between about 150 W and about 350 W, and most preferably to about 250 W. Decreasing the RF power, however, also decreases the deposition rate of the a-C:B layer and thus increases processing time. This may be countered by increasing the boron flow rate, for example by increasing the diborane flow to between about 800 sccm and about 2,500 sccm, and more preferably to between about 1,000 sccm and about 1,300 sccm, and most preferably to about 1,100 sccm. In this embodiment, the boron concentration is increased to between about 10 atom % and about 25 atom %. As a result of the increased boron concentration, this film has a lower ash rate when subjected to an $O_2$ plasma and is more difficult to remove with a conventional ash step. Adding $CF_4$ and/or $H_2$ during the ash step will increase the rate of a-C:B removal.

Figure 10:
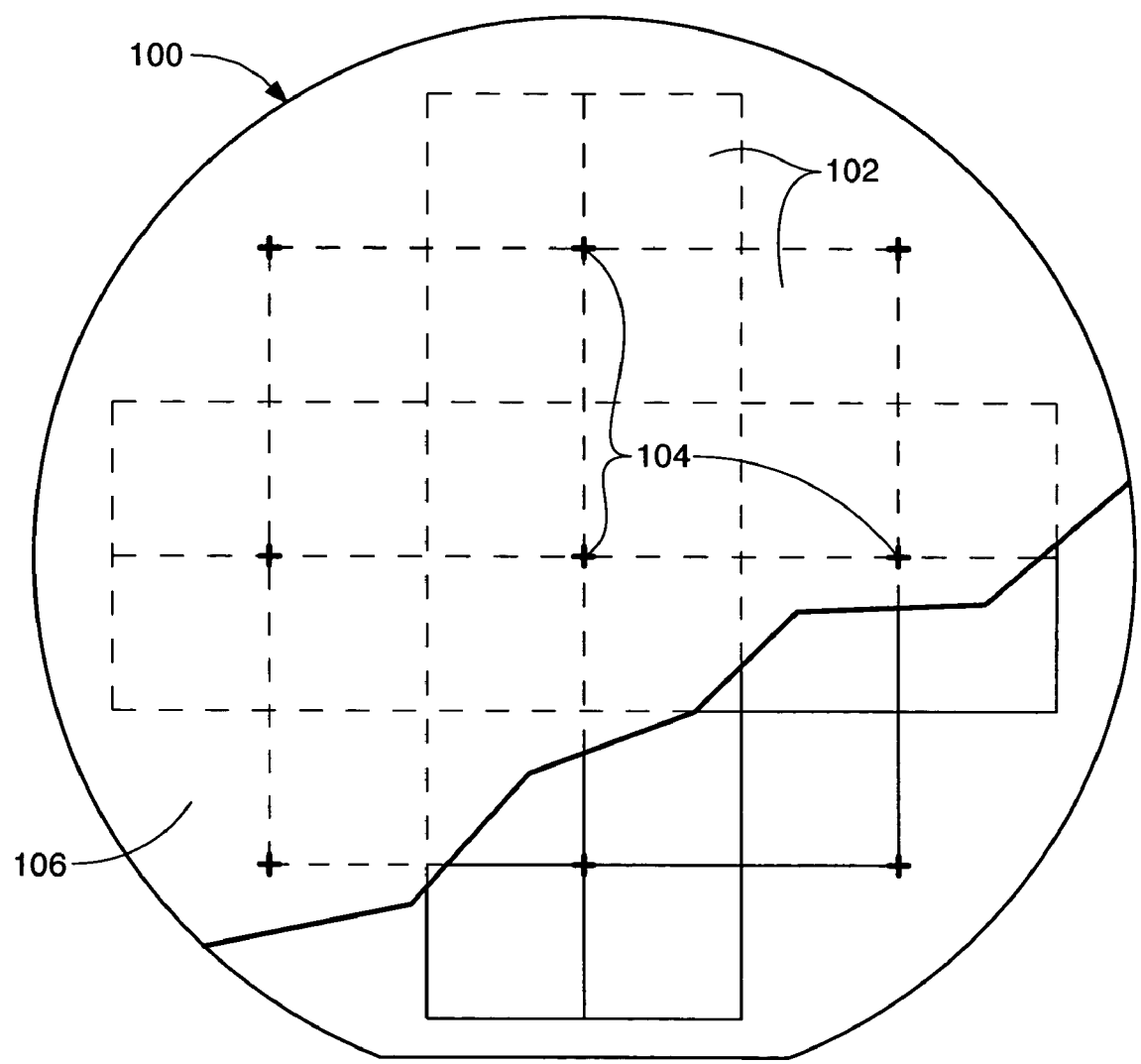
FIG. 10 is a plan view of a semiconductor wafer having a boron-doped amorphous carbon hard mask formed thereover.

FIG. 10 depicts a wafer 100 comprising semiconductor die 102, wafer alignment marks 104, and a partially cut away translucent a-C:B layer thereover 106 which allows for detection of the alignment marks 104 by photolithography equipment (not depicted) through the a-C:B layer.

Figure 11:
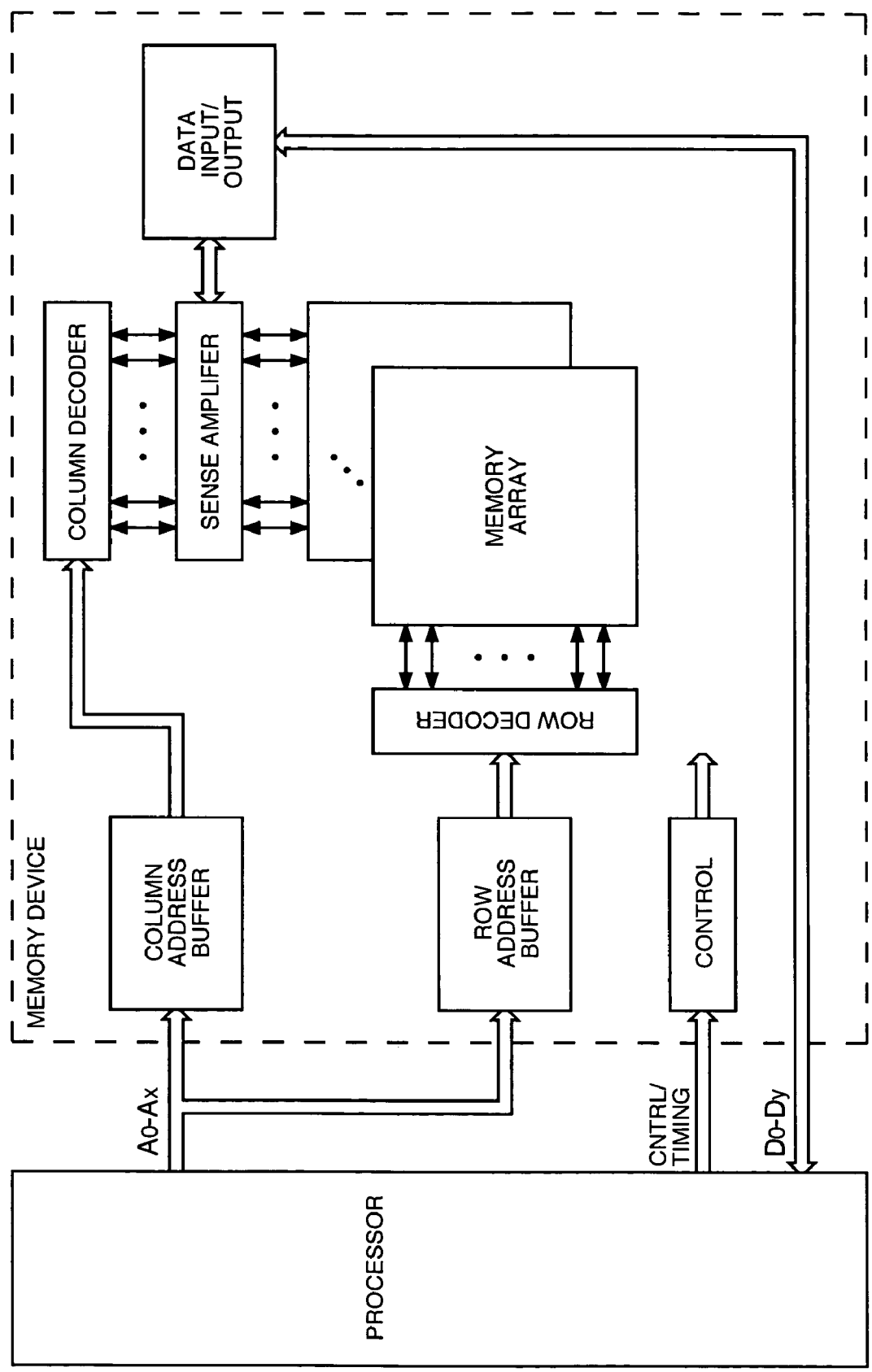
FIG. 11 is a simplified block diagram of a memory array which may be formed using an embodiment of the present invention.

FIG. 11 is a simplified block diagram of a memory device such as a dynamic random access memory which may be formed using an embodiment of the present invention. The general operation of such a device is known to one skilled in the art. FIG. 11 depicts a processor coupled to a memory device, and further depicts the following basic sections of a memory integrated circuit: control circuitry; row and column address buffers; row and column decoders; sense amplifiers; memory array; and data input/output.

Figure 12:
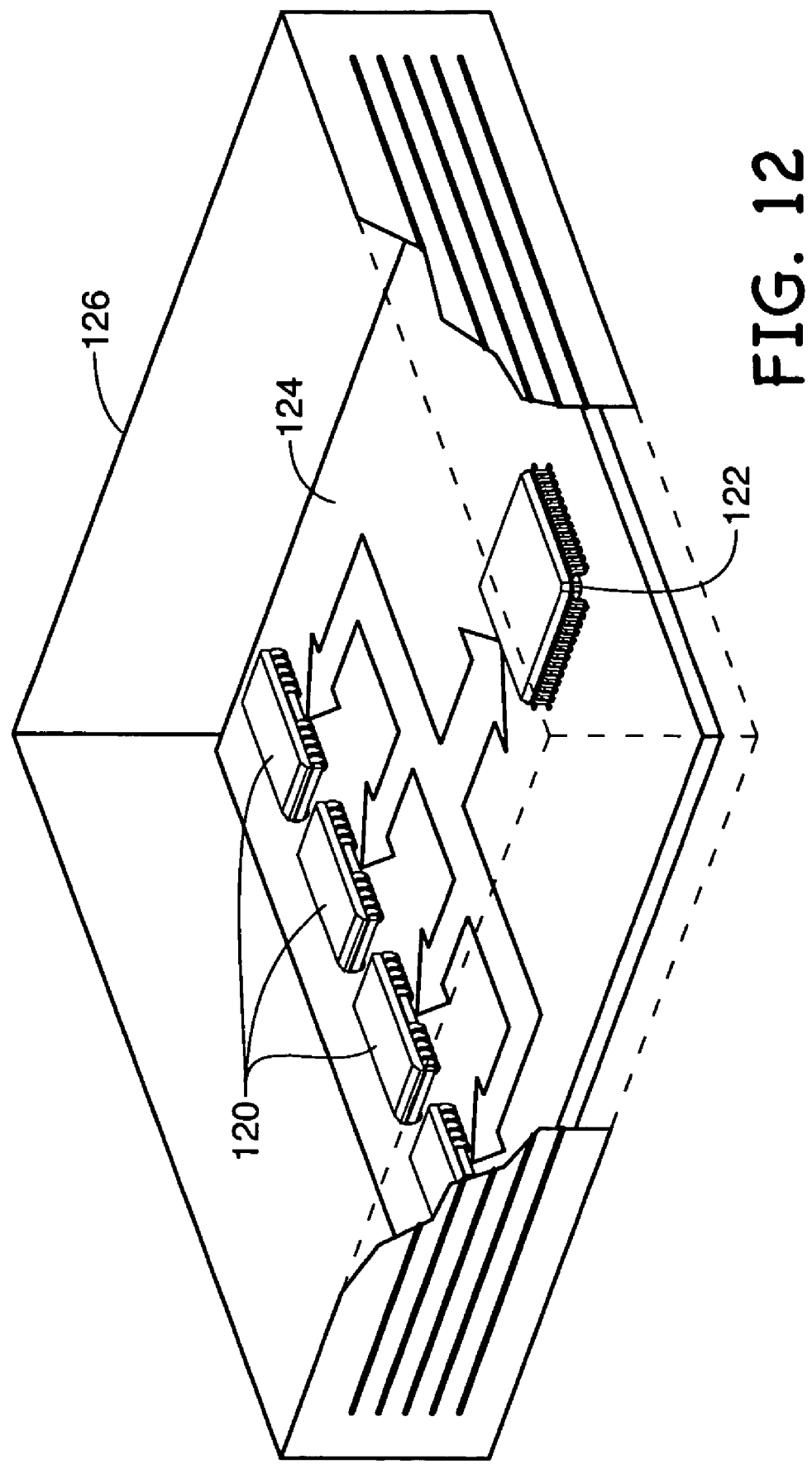
FIG. 12 depicts a possible use of the invention.

As depicted in FIG. 12, a semiconductor device 120 formed in accordance with the invention may be attached along with other devices such as a microprocessor 122 to a printed circuit board 124, for example to a computer motherboard or as a part of a memory module used in a personal computer, a minicomputer, or a mainframe 126. FIG. 12 may also represent use of device 120 in other electronic devices comprising a housing 126, for example devices comprising a microprocessor 122, related to telecommunications, the automobile industry, semiconductor test and manufacturing equipment, consumer electronics, or virtually any piece of consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, it should be noted that the a-C:B hard mask can be used at any masking level as a hard mask, for example during the formation of capacitors, shallow trench isolation, digit line contact openings, or virtually any semiconductor-related processing where a mask is required. It is therefore contemplated that the appended claims will cover any such modifications or embodiments as fall within the true scope of the invention.

What is claimed is:

1. An in-process semiconductor device, comprising:
 a semiconductor wafer substrate assembly comprising a semiconductor wafer and alignment indicia;
 an oxide layer overlying the semiconductor wafer and the alignment indicia, wherein the oxide layer has an etched portion therein which forms a recess in the oxide layer;
 a patterned amorphous carbon layer having an opening therein over the oxide layer to be etched, the amorphous carbon layer comprising a boron concentration of between about 1 atom % and about 35 atom %;
 wherein the opening in the amorphous carbon layer is continuous with the recess in the oxide layer, and the alignment indicia are detectable through the amorphous carbon layer and through the oxide layer.

2. The in-process semiconductor device of claim 1 further comprising a deposited antireflective coating (DARC) overlying the amorphous carbon layer, the antireflective coating having an opening therein which is continuous with the opening in the amorphous carbon layer.

3. The in-process semiconductor device of claim 2 further comprising a patterned photoresist layer overlying and contacting the amorphous carbon layer and having an opening therein which is continuous with the opening in the DARC layer.

4. The in-process semiconductor device of claim 1 further comprising a photoresist layer having an opening therein, wherein the opening in the photoresist layer is aligned with the opening in the amorphous carbon layer.

5. The in-process semiconductor device of claim 1 wherein the patterned amorphous carbon layer has a thickness of between about 800 angstroms and about 3,000 angstroms.

* * * * *

UNITED STATES PATENT AND TRADEMARK OFFICE
CERTIFICATE OF CORRECTION

PATENT NO. : 7,576,441 B2
APPLICATION NO. : 11/214367
DATED : August 18, 2009
INVENTOR(S) : Yin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 776 days.

Signed and Sealed this

Seventh Day of September, 2010

David J. Kappos
*Director of the United States Patent and Trademark Office*